United States Patent
Milanesi et al.

(10) Patent No.: US 6,169,453 B1
(45) Date of Patent: Jan. 2, 2001

(54) ERROR AMPLIFIER WITH A HIGH COMMON MODE REJECTION

(75) Inventors: Andrea Milanesi, Casalnoceto; Vanni Poletto, Casale Monferrato, both of (IT)

(73) Assignee: STMicroelectronics S.r.l., Agrate Brianza (IT)

( * ) Notice: Under 35 U.S.C. 154(b), the term of this patent shall be extended for 0 days.

(21) Appl. No.: 09/314,048

(22) Filed: May 18, 1999

(30) Foreign Application Priority Data

May 22, 1998 (EP) ................................................. 98830318

(51) Int. Cl.[7] ........................................................ H03F 3/45
(52) U.S. Cl. .............................. 330/258; 330/86; 330/260; 330/9
(58) Field of Search ............................... 330/9, 252, 257, 330/258, 260, 86, 69, 110

(56) References Cited

U.S. PATENT DOCUMENTS

| | | | |
|---|---|---|---|
| 4,034,308 | * | 7/1977 | Wermuth et al. ...................... 330/86 |
| 4,641,105 | | 2/1987 | Albaugh et al. ......................... 330/9 |
| 5,319,265 | | 6/1994 | Lim ....................................... 307/494 |
| 5,548,453 | * | 8/1996 | Sasaki et al. ............................ 330/9 |
| 5,777,515 | * | 7/1998 | Kimura ................................ 330/257 |
| 6,028,482 | * | 2/2000 | Herrie ..................................... 330/86 |
| 6,064,257 | * | 5/2000 | Sauer ...................................... 330/9 |

FOREIGN PATENT DOCUMENTS 0 534 007 A1   9/1991   (EP) .

* cited by examiner

*Primary Examiner*—Robert Pascal
*Assistant Examiner*—Khanh Van Nguyen
(74) *Attorney, Agent, or Firm*—Theodore E. Galanthay; Allen, Dyer, Doppelt, Milbrath & Gilchrist, P.A.

(57) ABSTRACT

A differential amplifier provides a high common mode rejection while maintaining substantially unchanged the input dynamic range. The differential amplifier includes a comparator having inputs to which are applied the two input signals, which are also applied to an operational amplifier, so that the comparator outputs a signal whose sign is indicative of the sign of the difference between the two input signals. The output of the operational amplifier is feedback to one of the inputs of the operational amplifier through a current mirror. This feedback signal is switched between the non-inverting input of the operational amplifier and the inverting input of the operational amplifier. The switching of the feedback signal ensures negative feedback, and is dependent upon the sign of the difference detected by the comparator.

30 Claims, 2 Drawing Sheets

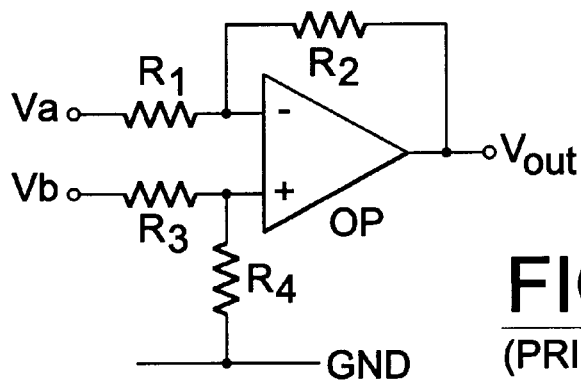
FIG. 1.
(PRIOR ART)
FIG. 2a.
(PRIOR ART)
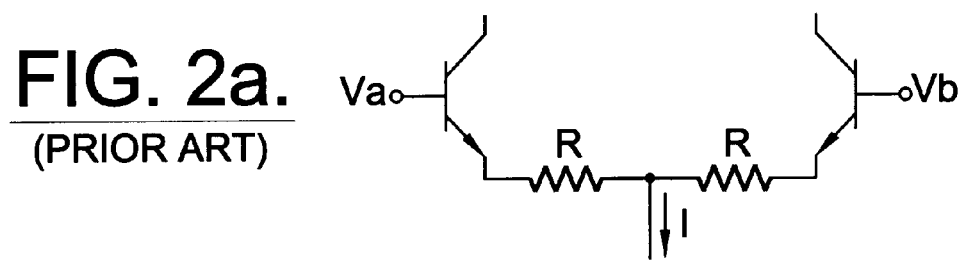
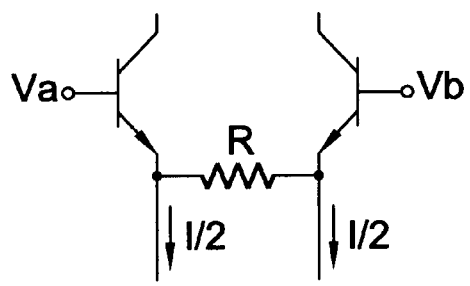
FIG. 2b.
(PRIOR ART)

ERROR AMPLIFIER WITH A HIGH COMMON MODE REJECTION

FIELD OF THE INVENTION

The present invention relates to the field of semiconductor devices and, more particularly, to a differential amplifier.

BACKGROUND OF THE INVENTION

A differential amplifier is an analog circuit that provides an output signal (Vout) corresponding to a difference between two input voltage signals (Va−Vb). The output signal is multiplied by a gain factor, which is defined in the design stage of the differential amplifier.

A traditional prior art scheme of a differential amplifier is shown in FIG. 1. A description of this circuit can be found in any basic electronics textbook, and is generally based on an operational feedback amplifier. The main drawback of the traditional differential amplifier of FIG. 1 is poor common mode rejection. This is because any spread of the value of the resistances about their nominal design value produces a common mode output signal.

A different approach to a differential amplifier is based on the use of a degeneration resistance connected between the emitters of an input pair of transistors, according to either one of the two circuits shown in FIG. 2. According to this alternative approach, the common mode rejection can be significantly enhanced although a limit is placed on the maximum swing of the input voltages, which can no longer swing as far as the power supply voltage. It is evident that there is a need for a differential amplifier capable of ensuring an enhanced common mode rejection without restricting the voltage swing, and keeping the inputs compatible with the power supply voltage.

SUMMARY OF THE INVENTION

A differential amplifier according to the present invention provides a high common mode rejection while maintaining substantially unchanged the input dynamic range. The differential amplifier includes a comparator having inputs to which are applied two input signals so that the comparator outputs a signal whose sign is indicative of the sign of the difference between the two input signals.

The output of the operational amplifier is feedback to one of the inputs of the operational amplifier through a current mirror. This feedback signal is switched between the non-inverting input of the operational amplifier and the inverting input of the operational amplifier. The switching of the feedback signal ensures negative feedback, and is dependent upon the sign of the difference detected by the comparator.

An output stage is connected in cascade to the output of the operational amplifier. Also connected therebetween is a stage whose function is to invert the sign of the output signal of the operational amplifier. This inversion is dependent upon the sign information provided by the comparator. The output signal, whether inverted or not by the dedicated stage placed in cascade to the operational amplifier, drives the output stage. The output stage includes a transistor and a resistive load. The value of the resistive load may be selected to define a certain multiplying factor for the difference between the input signals.

The output stage forms the input branch of a current mirror that applies a feedback current either on the inverting or on the non-inverting input node of the operational amplifier. The feedback current is applied through a switch controlled by the output of the comparator.

BRIEF DESCRIPTION OF THE DRAWINGS

FIGS. 1, 2a and 2b are basic diagrams of differential amplifiers according to the prior art;

DETAILED DESCRIPTION OF THE PREFERRED EMBODIMENTS

Figure 3:
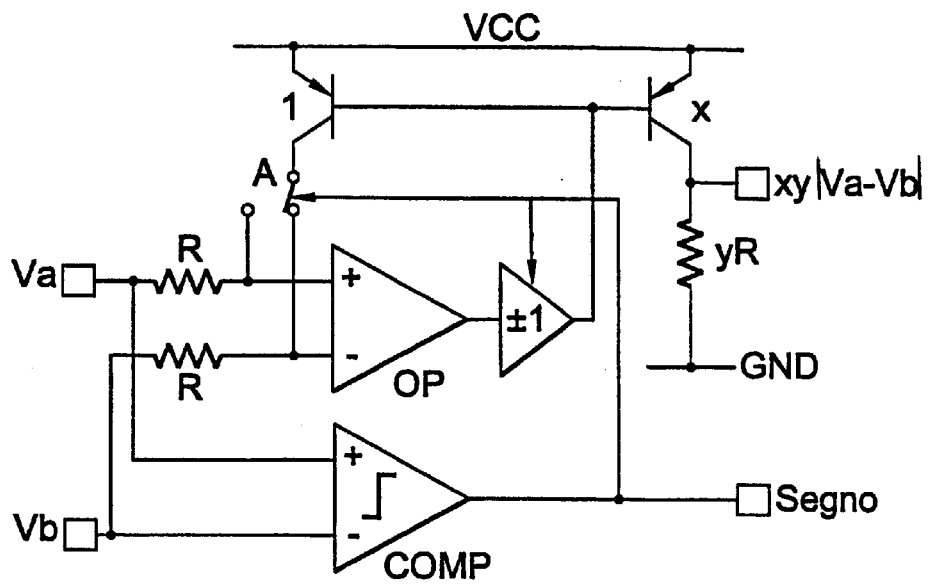
FIG. 3 is a basic diagram of the differential amplifier according to the present invention.

By referring to FIG. 3, the basic circuit diagram of the differential amplifier according to the present invention includes a common operational amplifier OP. Input signals Va and Vb are respectively applied to the inverting (−) and the non-inverting (+) inputs of the operational amplifier. The input signals Va and Vb are applied through respective input resistances, each having an identical value R. The output signal of the operational amplifier drives an output stage. The output signal may or may not be inverted. The output stage in the example is formed by a bipolar junction transistor x (e.g., a PNP transistor) and by a resistive load yR.

An inverter is coupled in cascade to the output of the operational amplifier OP and has the function of inverting the signal output by the operational amplifier depending on the sign of the difference between input voltage signals Va−Vb. This sign information is provided by a dedicated zero-cross comparator COMP. The input voltage signals Va and Vb are respectively applied to the inputs of the comparator COMP.

The transistor x of the output stage of the differential amplifier of the present invention forms the input branch of a current mirror that includes a second bipolar junction PNP transistor 1. The output signal of the comparator COMP represents the sign of the difference between the input voltage signals Va−Vb and controls the switch A that selects either the inverting (−) or the noninverting (+) input node of the operational amplifier OP. Either one of these inputs applies the feedback current provided by the transistor 1 of the current mirror. The current mirror is thus formed by the transistors 1 and x. The output signal of the comparator COMP also controls switching of the inverter.

By switching to one of the inputs of the operational amplifier OP, and by inverting or not inverting the signal output by the operational amplifier OP, the determination of the sign of the signal output by the operational amplifier OP is always known. In addition, negative feedback for the operational amplifier OP is always provided under any circumstances. The common mode gain of the circuit of the present invention is practically zero. In fact, the operational amplifier OP regulates the current through the two branches of the current mirror formed by the transistors x and 1 so that its inverting (−) and noninverting (+) inputs are at the same voltage. Consequently, the entire circuit operates in a linear mode.

Accordingly, when input voltage signals Va and Vb are different, current will not flow through one of the two input resistances R while the voltage difference |Va−Vb| will be applied across the other input resistance. However, the current flowing through the biased input resistance is mirrored on the load resistance yR of the output stage, and is multiplied by an x factor that corresponds to the current gain of the PNP transistor included in the output stage.

By assuming that the load resistance of the output stage is y times a value of the input resistance R, the output voltage Vout is then given by:

Vout=$x * y * |Va-Vb|$.

When input voltage signals Va and Vb are at the same voltage, it is evident that no current can flow in the input resistances R. Therefore, the output of the circuit will be zero (Vout=0).

Figure 4:
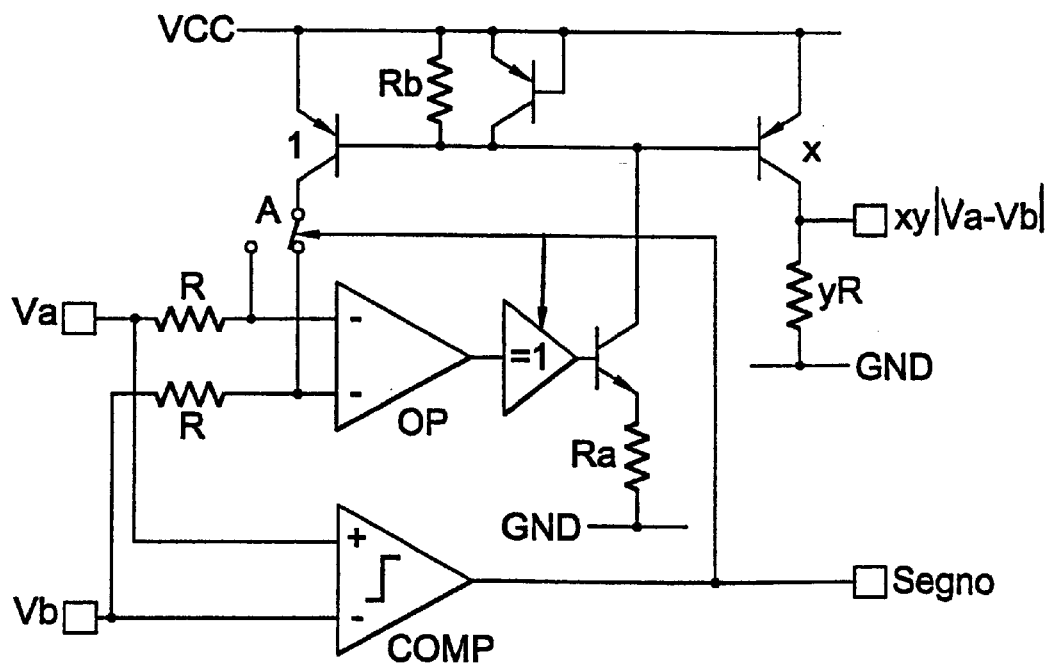
FIG. 4 shows an alternative embodiment of the differential amplifier according to the present invention.

Any instability at high frequency of the circuit of FIG. 3 may be prevented by using a modified circuit as shown in FIG. 4. According to this preferred embodiment of the circuit of the present invention, it is possible to regulate the loop gain of the circuit. To this end, a dedicated intermediate amplifying stage drives the transistor x of the output stage, as well as driving the feedback current mirror.

The loop gain will be determined by the ratio Ra/R. In order to ensure stability, it is preferable to design the ratio to be significantly greater than 1. The resistance Rb and the diode D are used to always maintain the transistor 2 in an active region, even when the input voltage difference (Va-Vb) is zero. The circuit of the differential amplifier of the present invention is useful in numerous applications, particularly when a very high common mode rejection is required.

That which is claimed is:

1. A differential amplifier comprising:
   an operational amplifier;
   a first circuit generating an output signal representative of a sign of a difference between respective input signals applied to an inverting input and a non-inverting input of said operational amplifier;
   a feedback circuit connected to an output of said operational amplifier providing a negative feedback signal to said operational amplifier; and
   a switch circuit connected between said feedback circuit and respective inputs of said operational amplifier;
   said switch circuit being controlled by the output signal provided by said first circuit for maintaining the negative feedback signal to said operational amplifier.

2. A differential amplifier according to claim 1, wherein said feedback circuit comprises a feedback current mirror comprising a first current branch and a second current branch.

3. A differential amplifier according to claim 2, wherein said switch circuit comprises:
   a switch connected between said second current branch and either the inverting input or the non-inverting input of said operational amplifier; and
   a switchable inverter having an input connected to an output of said operational amplifier and an output connected to said first current branch;
   said switch and said switchable inverter being controlled by the output signal provided by said first circuit.

4. A differential amplifier according to claim 1, wherein said first circuit comprises a comparator having a non-inverting input and an inverting input connected to respective inputs of said operational amplifier.

5. A differential amplifier according to claim 2, wherein said first current branch comprises a first transistor and said second current branch comprises a second transistor.

6. A differential amplifier according to claim 1, further comprising an intermediate gain stage comprising a third transistor connected between the output of said operational amplifier and said feedback circuit.

7. A differential amplifier according to claim 6, further comprising a first resistance connected to respective inputs of said operational amplifier; and wherein said intermediate gain stage further comprises a fourth resistance connected between said third transistor and a second voltage reference, a ratio of said fourth resistance to said first resistance being greater than one.

8. A differential amplifier according to claim 6, wherein said intermediate gain stage further comprises a a biasing resistance connected in parallel to a diode, said biasing resistance and said diode being connected between a first voltage reference and said feedback circuit.

9. A differential amplifier according to claim 5, wherein each of said first and second transistors comprises a PNP transistor.

10. A differential amplifier according to claim 6, wherein said third transistor comprises an NPN transistor.

11. A differential amplifier according to claim 7, wherein the second voltage reference is ground.

12. A differential amplifier comprising:
    an operational amplifier;
    a first circuit generating an output signal representative of a sign of a difference between respective input signals applied to an inverting input and a non-inverting input of said operational amplifier;
    a feedback current mirror connected to an output of said operational amplifier and providing a negative feedback signal to said operational amplifier, said feedback current mirror comprising a first current branch and a second current branch;
    a switch connected between said second current branch and either the inverting input or the non-inverting input of said operational amplifier; and
    a switchable inverter having an input connected to an output of said operational amplifier and an output connected to said first current branch;
    said switch and said switchable inverter being controlled by the output signal provided by said first circuit for maintaining the negative feedback signal to said operational amplifier.

13. A differential amplifier according to claim 12, wherein said first circuit comprises a comparator having a non-inverting input and an inverting input connected to respective inputs of said operational amplifier.

14. A differential amplifier according to claim 12, wherein said feedback current mirror comprises a first transistor and a second transistor.

15. A differential amplifier according to claim 12, further comprising an intermediate gain stage comprising a third transistor connected between the output of said switchable inverter and said first current branch.

16. A differential amplifier according to claim 15, further comprising a first resistance connected to respective inputs of said operational amplifier; and wherein said intermediate gain stage further comprises a fourth resistance connected between said third transistor and a second voltage reference, a ratio of said fourth resistance to said first resistance being greater than one.

17. A differential amplifier according to claim 15, wherein said intermediate gain stage further comprises a a biasing resistance connected in parallel to a diode, said biasing resistance and said diode being connected between a first voltage reference and said feedback current mirror.

18. A differential amplifier according to claim 14, wherein each of said first and second transistors comprises a PNP transistor.

19. A differential amplifier according to claim 15, wherein said third transistor comprises an NPN transistor.

20. A differential amplifier according to claim 16, wherein the second voltage reference is ground.

21. A method for operating a differential amplifier, the method comprising the steps of:

generating a first output signal representative of a sign of a difference between respective input signals applied to an inverting input and a non-inverting input of the operational amplifier;

connecting a feedback circuit to an output of the operational amplifier for providing a negative feedback signal to the operational amplifier; and switching the negative feedback signal between respective inputs of the operational amplifier responsive to the first output signal for maintaining the negative feedback signal being applied to the operational amplifier.

22. A method according to claim 21, wherein the feedback circuit comprises a current mirror comprising a first current branch and a second current branch; and wherein the step of switching comprises switching the negative feedback signal between the second current branch and the respective inputs of the operational amplifier.

23. A method according to claim 21, further comprising the step of inverting a second output signal provided by the operational amplifier; and wherein the step of switching further comprises inverting the second output signal responsive to the first output signal.

24. A method according to claim 22, wherein said feedback current mirror comprises a first transistor and a second transistor.

25. A method according to claim 21, further comprising the step of connecting a third transistor between the output of the operational amplifier and the feedback circuit.

26. A method according to claim 21, the operational amplifier further comprising a first resistance connected to respective inputs of the operational amplifier; and further comprising the step of connecting a fourth resistance between the third transistor and a second voltage reference, a ratio of the fourth resistance to the first resistance being greater than one.

27. A method according to claim 21, further comprising the steps of connecting a biasing resistance in parallel to a diode, the biasing resistance and the diode being connected between a first voltage reference and the feedback circuit.

28. A method according to claim 24, wherein each of the first and second transistors comprises a PNP transistor.

29. A method according to claim 25, wherein the third transistor comprises an NPN transistor.

30. A method according to claim 26, wherein the second voltage reference is ground.

* * * * *